US012696601B2

(12) United States Patent
Zhu et al.

(10) Patent No.: US 12,696,601 B2
(45) Date of Patent: Jul. 28, 2026

(54) DRIVING BACKPLATE WITH CONNECTING LINE, CONNECTING SIGNAL LINE, AND FAN-OUT LINE, DISPLAY PANEL, AND DISPLAY DEVICE

(71) Applicant: BOE Technology Group Co., Ltd., Beijing (CN)

(72) Inventors: Xiaoyan Zhu, Beijing (CN); Xinhong Lu, Beijing (CN); Ling Li, Beijing (CN); Hua Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 467 days.

(21) Appl. No.: 18/028,309

(22) PCT Filed: Jan. 28, 2021

(86) PCT No.: PCT/CN2021/074223
§ 371 (c)(1),
(2) Date: Mar. 24, 2023

(87) PCT Pub. No.: WO2022/160203
PCT Pub. Date: Aug. 4, 2022

(65) Prior Publication Data
US 2023/0378411 A1 Nov. 23, 2023

(51) Int. Cl.
*H01L 33/62* (2010.01)
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ... H01L 33/62; H01L 25/0753; H01L 25/167; H05K 2201/09236
See application file for complete search history.

(56) References Cited

U.S. PATENT DOCUMENTS

| | | | |
|---|---|---|---|
| 2013/0141877 A1 | 6/2013 | Lau et al. | |
| 2022/0406875 A1 | 12/2022 | Zhang et al. | |

(Continued)

FOREIGN PATENT DOCUMENTS

| | | |
|---|---|---|
| CN | 102540593 A | 7/2012 |
| CN | 108447887 A | 8/2018 |

(Continued)

OTHER PUBLICATIONS

CN 202180000082.8 second office action dated Jan. 24, 2025.
PCT/CN2021/074223 international search report.

*Primary Examiner* — Joseph L Williams
(74) *Attorney, Agent, or Firm* — IPro, PLLC

(57) ABSTRACT

A driving backplate, a display panel, and a display device. The driving backplate comprises: a base substrate, comprising a display area and a fan-out area located on at least one side of the display area. The display comprises a plurality of pixel units arranged in an array, and a plurality of signal lines connected to the pixel units, and the plurality of signal lines extend in a first direction; the fan-out area comprises fan-out lines, the fan-out lines are connected to the signal lines, the fan-out line comprises a first end proximate to the display area and a second end distant from the display area, and the width of the first end is greater than the width of the second end; at least one signal line is connected to at least one fan-out line by means of a connecting line, and the connecting line extends in a second direction.

20 Claims, 9 Drawing Sheets

(56)  References Cited

U.S. PATENT DOCUMENTS

2024/0145191 A1 * 5/2024 Morinet ................... H01H 5/20
2024/0431165 A1 * 12/2024 Wang .................... G06F 3/0412

FOREIGN PATENT DOCUMENTS

| CN | 110045554 | A | 7/2019 |
|----|-----------|---|--------|
| CN | 111243486 | A | 6/2020 |
| CN | 210805177 | U | 6/2020 |
| CN | 211654192 | U | 10/2020 |
| CN | 111933674 | A | 11/2020 |

* cited by examiner

DRIVING BACKPLATE WITH CONNECTING LINE, CONNECTING SIGNAL LINE, AND FAN-OUT LINE, DISPLAY PANEL, AND DISPLAY DEVICE

The present application is a National Stage of International Application No. PCT/CN2021/074223, filed on Jan. 28, 2021, which is hereby incorporated by reference in its entirety.

FIELD

The present disclosure relates to the field of display, in particular to a driving backplate, a display panel and a display apparatus.

BACKGROUND

Light-emitting diodes of sub-millimeter magnitudes or even micron magnitudes based on an inorganic light-emitting diode principle belong to self-luminous devices as organic light-emitting diodes (OLEDs) and have a series of advantages such as high brightness, ultra-low delay, and a huge viewing angle like the OLEDs. Moreover, since light emitting of inorganic light-emitting diodes is achieved based on a metal semiconductor with a more stable property and a lower resistance, the inorganic light-emitting diodes have advantages of being lower in power consumption, more resistant to high temperature and low temperature and longer in service life compared with the OLEDs which achieve light emitting based on organic matter.

SUMMARY

Embodiments of the present disclosure provide a driving backplate, a display panel and a display apparatus, and a specific solution is as follows.

In one aspect, an embodiment of the present disclosure provides a driving backplate, including: a base substrate, including a display area and a fan-out area located on at least one side of the display area; wherein the display area includes a plurality of pixel units arranged in an array and a plurality of signal lines connected with the pixel units, and the signal lines extend in a first direction; the fan-out area includes a plurality of fan-out lines connected with the plurality of signal lines, each of the fan-out lines includes a first end proximate to the display area and a second end away from the display area, and a width of the first end is greater than a width of the second end; and at least one signal line is connected with at least one fan-out line through a connecting line, and the connecting line extends in a second direction.

Optionally, in the driving backplate provided by the embodiment of the present disclosure, a length of the connecting line is greater than or equal to a spacing distance between two adjacent pixel units in the second direction and less than or equal to a sum of a width of a single pixel unit column and the spacing distance between the two adjacent pixel units.

Optionally, in the driving backplate provided by the embodiment of the present disclosure, the signal lines connected with the fan-out lines through connecting lines are connected with pixel unit columns on outmost sides.

Optionally, in the driving backplate provided by the embodiment of the present disclosure, at least one signal line is directly connected with at least one fan-out line.

Optionally, in the driving backplate provided by the embodiment of the present disclosure, the fan-out area is folded to an opposite side of a display side of the driving backplate, and a minimum distance between the connecting lines and a bending axis in the first direction is greater than 150 μm.

Optionally, in the driving backplate provided by the embodiment of the present disclosure, a minimum distance between the fan-out lines and a boundary of the base substrate in the second direction is greater than 1000 μm.

Optionally, in the driving backplate provided by the embodiment of the present disclosure, a gap between two adjacent signal lines in the second direction is greater than 100 μm and a gap between two adjacent connecting lines in the first direction is greater than 100 μm.

Optionally, in the driving backplate provided by the embodiment of the present disclosure, the fan-out area includes a first fan-out area located on a side of the display area; and parts of the fan-out lines in the first fan-out area are connected with the signal lines through connecting lines, and a rest of the fan-out lines are directly connected with the signal lines.

Optionally, in the driving backplate provided by the embodiment of the present disclosure, the fan-out area further includes a second fan-out area, and the second fan-out area and the first fan-out area are located on two sides of the display area in the second direction respectively; and the fan-out lines in the second fan-out area are directly connected with the signal lines.

Optionally, in the driving backplate provided by the embodiment of the present disclosure, the signal lines include a plurality of data signal lines, a plurality of reference signal lines and a plurality of positive signal lines; each pixel unit column is electrically connected with one data signal line, one reference signal line and one positive signal line correspondingly, and a distance between a boundary of the base substrate and the data signal line corresponding to the pixel unit column, a distance between a boundary of the base substrate and the reference signal line corresponding to the pixel unit column and a distance between the boundary of the base substrate and the positive signal line corresponding to the pixel unit column are sequentially increased; the pixel units form M pixel unit columns sequentially arranged in the second direction, two pixel unit columns on outmost sides are respectively a first pixel unit column and an $M^{th}$ pixel unit column, and, in the second direction, a distance between a data signal line corresponding to the first pixel unit column and a boundary of the base substrate is less than a distance between a data signal line corresponding to the $M^{th}$ pixel unit column and a boundary of the base substrate; the data signal lines corresponding to the first pixel unit column, a second pixel unit column and the $M^{th}$ pixel unit column respectively are connected with the fan-out lines in the first fan-out area through connecting lines; the data signal lines corresponding to a third pixel unit column to an $(M-1)^{th}$ pixel unit column respectively are directly connected with the fan-out lines in the first fan-out area; and the plurality of reference signal lines and the plurality of positive signal lines are directly connected with the fan-out lines in the second fan-out area.

Optionally, in the driving backplate provided by the embodiment of the present disclosure, the signal lines further include transfer signal lines between the data signal lines and the reference signal lines and between the $M^{th}$ pixel unit column and the boundary of the base substrate, and each of the transfer signal lines is electrically connected with one pixel unit row; the transfer signal line between the data signal line and the reference signal line corresponding to the first pixel unit column, the transfer signal line between the data signal line and the reference signal line corresponding to the $M^{th}$ pixel unit column and the transfer signal line between the $M^{th}$ pixel unit column and the boundary of the base substrate are connected with the fan-out lines in the first fan-out area through the connecting lines; and the transfer signal lines between the data signal lines and the reference signal lines corresponding to the third pixel unit column to the $(M-1)^{th}$ pixel unit column respectively are directly connected with the fan-out lines in the first fan-out area.

Optionally, the driving backplate provided by the embodiment of the present disclosure further includes a plurality of scanning signal lines, wherein the scanning signal lines extend between the pixel unit rows in the second direction, and each of the scanning signal lines is electrically connected with one transfer signal line.

Optionally, the driving backplate provided by the embodiment of the present disclosure includes a first conducting layer and a second conducting layer which are sequentially arranged on the base substrate and are insulated from each other; and the data signal lines, the reference signal lines, the positive signal lines and the transfer signal lines are located in the first conducting layer, and the scanning signal lines are located in the second conducting layer.

Optionally, the driving backplate provided by the embodiment of the present disclosure further includes a first binding area arranged on a side of the first fan-out area away from the display area and a second binding area arranged on a side of the second fan-out area away from the display area; the first binding area is provided with a first chip, and the fan-out lines in the first fan-out area are in binding connection with the first chip; the second binding area is provided with a second chip and a third chip, and the second chip and the third chip are symmetrically arranged with respect to a central axis of the display area in the first direction; and the fan-out lines in the second fan-out area located on a side of the central axis of the display area in the first direction are in binding connection with the second chip, and the fan-out lines in the second fan-out area located on the other side of the central axis of the display area in the first direction are in binding connection with the third chip.

In another aspect, an embodiment of the present disclosure provides a display panel, including the above driving backplate and a plurality of micro light-emitting diodes electrically connected with the driving backplate.

In another aspect, an embodiment of the present disclosure provides a display apparatus, including a plurality of display panels, and the plurality of display panels are arranged in a splicing mode.

DETAILED DESCRIPTION OF THE EMBODIMENTS

Figure 1:
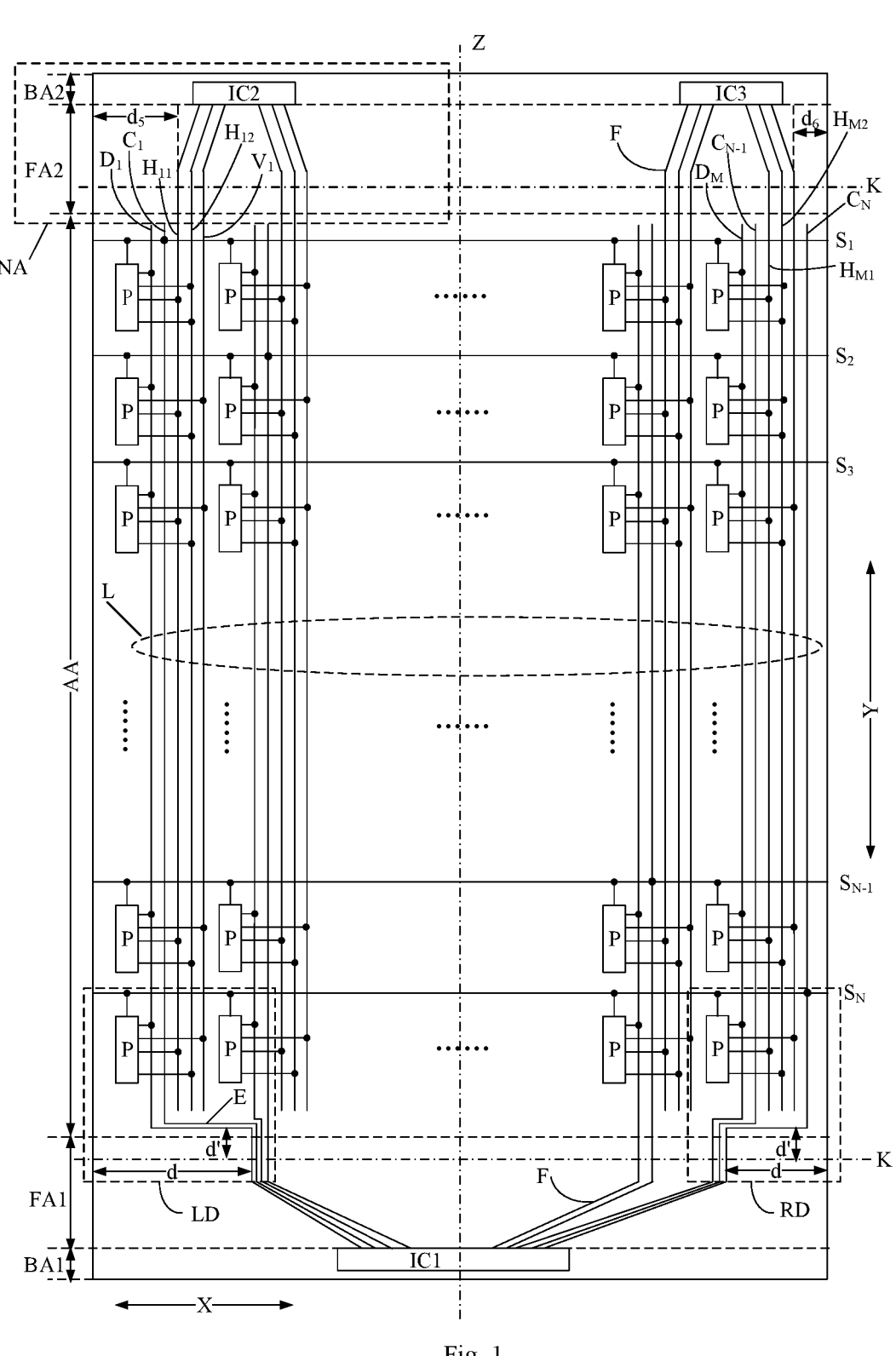
FIG. 1 is a schematic structural diagram of a driving backplate provided by an embodiment of the present disclosure.

To make the objectives, technical solutions and advantages of embodiments of the present disclosure clearer, the technical solutions of the embodiments of the present disclosure will be clearly and fully described below with reference to the accompanying drawings of the embodiments of the present disclosure. It should be noted that the size and shape of each figure in the accompanying drawings do not reflect a true scale and are only intended to schematically illustrate the content of the present disclosure, and the same or similar reference numerals indicate the same or similar elements or elements having the same or similar functions all the time. Obviously, the described embodiments are one part of embodiments of the present disclosure, not all of them. Based on the described embodiments of the present disclosure, all other embodiments acquired by those ordinarily skilled in the art without creative labor fall within the scope of protection of the present disclosure.

Unless otherwise defined, technical or scientific terms used herein shall have the ordinary meanings understood by those ordinarily skilled in the art to which the present disclosure pertains. "First", "second" and similar words used in the specification and claims of the present disclosure do not show any order, quantity or importance, and are merely used to distinguish different components. "Comprise", "include" or similar words indicate that an element or item appearing before such words covers listed elements or items appearing after the words and equivalents thereof, and do not exclude other elements or items. "Inner", "outer", "upper", "lower", etc. are merely used to show a relative position relation, and when an absolute position of a described object is changed, the relative position relation may also be correspondingly changed.

A micro/mini-LED technology is used for miniaturizing a size of an existing inorganic light-emitting diode (LED) to 500 μm and below, the size is about 1% of a size of an existing LED, then, a micro/min-LED of a micron magnitude is transferred onto a driving backplate through a mass transfer technology, and therefore various micro/min-LED displays of different sizes are formed. The micro/mini LEDs have a big advantage that is they can be spliced, and a plurality of small-size panels are spliced to achieve a large-size panel.

In the related art of forming the large-size panel by splicing the plurality of small-size panels, in order to reduce a splicing gap, fan-out areas of the small-size panels may be arranged on an opposite surface of a display side, so as to reduce a size of a non-display area of a single small-size panel, and therefore the size of a splicing gap between adjacent panels is as small as possible. However, an inventor finds that since a display area and the fan-out areas are directly connected, when a distance between a signal line on an outmost side and proximate to a panel edge and the panel edge is less than 100 μm, if the fan-out areas located on the display side are directly bent to the opposite surface of the display side, in a bending process, the edge signal line will be inevitably damaged due to larger bending stress on the edge, which causes a badness of line breaking.

Figure 2:
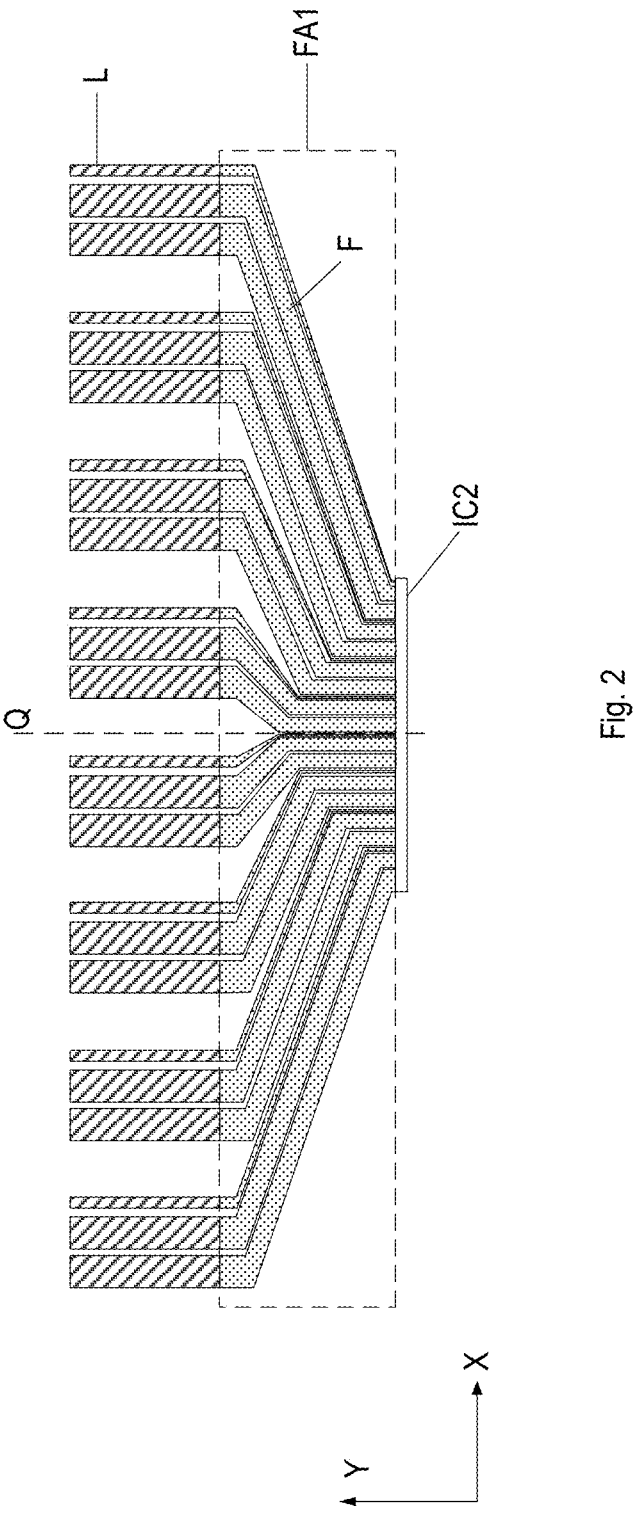
FIG. 2 is a schematic enlarged structural diagram of an area NA in FIG. 1.
Figure 3:
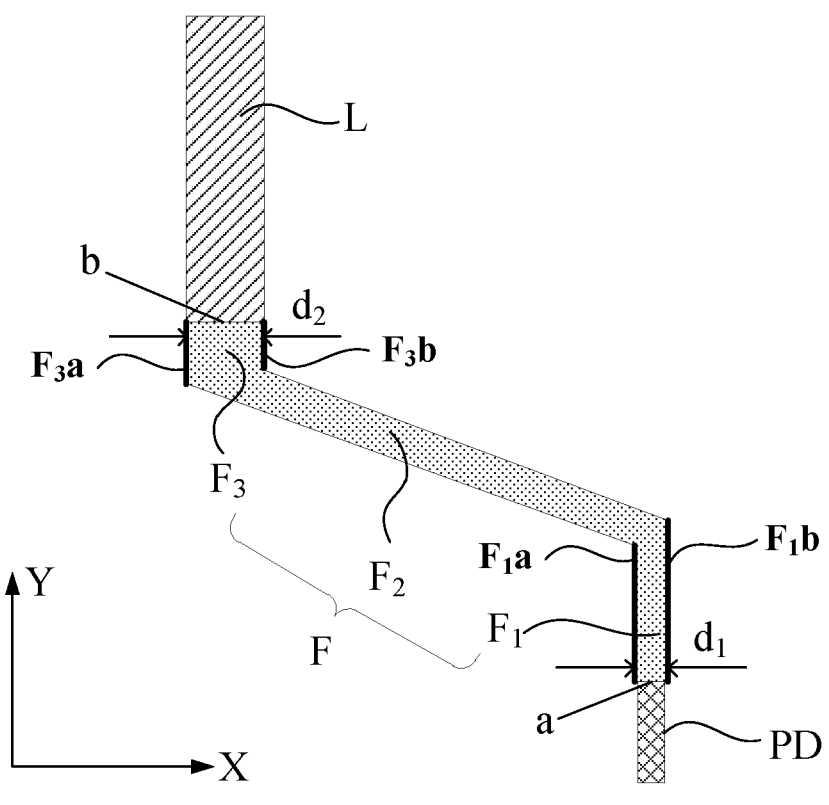
FIG. 3 is a schematic diagram of one fan-out line in FIG. 2.

To at least solve above technical problems existing in the related art, an embodiment of the present disclosure provides a driving backplate, as shown in FIG. 1, which may include: a base substrate, including a display area AA and a fan-out area (for example, a first fan-out area FA1 and/or a second fan-out area FA2) located on at least one side of the display area AA; the display area AA includes a plurality of pixel units P arranged in an array and a plurality of signal lines L (for example, $C_1$, $D_1$, $H_{11}$, $H_{12}$ and $V_1$, etc.) connected with the pixel units P, and the signal lines extend in a first direction Y; the fan-out area (for example, the first fan-out area FA1 and/or the second fan-out area FA2) includes a plurality of fan-out lines F connected with the plurality of signal lines L (for example, $C_1$, $D_1$, $H_{11}$, $H_{12}$ and $V_1$, etc.), each fan-out line F includes a first end b proximate to the display area AA and a second end a away from the display area AA, and a width $d_2$ of the first end b is greater than a width $d_1$ of the second end a, as shown in FIG. 2 and FIG. 3; and at least one signal line L (for example, $C_1$ and $D_1$, etc.) is connected with at least one fan-out line F through a connecting line E, and the connecting line E extends in a second direction X.

In the driving backplate provided by the embodiment of the present disclosure, the connecting lines E extending in the second direction X are arranged, the connecting lines E are connected with the signal lines (for example, $C_1$ and $D_1$, etc.) extending in the first direction Y to the fan-out lines F by using the connecting lines E, a minimum distance d between the fan-out lines F and a side edge of the base substrate parallel to the first direction Y is increased, and therefore when the fan-out area is bent to an opposite side (that is, a reverse side) of a display side, since a distance between the fan-out lines F and a boundary of the base substrate is increased, a badness of line breaking of the fan-out lines F due to too large bending stress on the edge may be effectively avoided, accordingly, cracks appearing on the signal lines (for example, $C_1$ and $D_1$, etc.) due to extending of cracks on the fan-out lines F to the signal lines (for example, $C_1$ and $D_1$, etc.) are avoided, and therefore a product yield is effectively improved. It may be understood that a material of the base substrate is a flexible material, such as polyimide, etc., which can achieve operation of bending a partial area of the base substrate.

It should be illustrated that FIG. 1 only exemplarily gives a connection relation of all the signal lines L, and thicknesses and widths of the lines do not represent actual shapes and actual widths of the signal lines L.

Referring to FIG. 1, in the present disclosure, the fan-out area may include the first fan-out area FA1 and the second fan-out area FA2, and the second fan-out area FA2 and the fan-out area FA1 are located on two sides of the display area AA in the second direction X respectively; a first binding area BA1 is arranged on a side of the first fan-out area FA1 away from the display area AA, a second binding area BA2 is arranged on a side of the second fan-out area FA2 away from the display area AA, the first binding area BA1 is provided with a first chip IC1, the second binding area BA2 is provided with a second chip IC2 and a third chip IC3, and the second chip IC2 and the third chip IC3 are symmetrically arranged with respect to a central axis Z of the display area AA in the first direction Y; one ends of parts of the fan-out lines F in the first fan-out area FA1 are connected with the signal lines L (for example, $C_1$ and $D_1$, etc.) through the connecting lines E, one ends of the rest of the fan-out lines F are directly connected with the signal lines (for example, $C_m$ and $D_m$, etc.), and the other ends of all the fan-out lines F in the first fan-out area FA1 are in binding connection with the first chip IC1; and one ends of all the fan-out lines F in the second fan-out area FA2 are directly connected with the signal lines L (for example, $H_{11}$, $H_{12}$ and $V_1$, etc.), the other ends of the fan-out lines F in the second fan-out area FA2 on one side of a central axis Z of the display area AA in the first direction Y are in binding connection with the second chip IC2, and the other ends of the fan-out lines F in the second fan-out area FA2 on the other side of the central axis Z of the display area AA in the first direction Y are in binding connection with the third chip IC3.

Through this arrangement, space on an upper side and a lower side of the display area AA may be reasonably used for performing line arrangement of the fan-out lines F, and a problem that space of a line arrangement area of the fan-out lines F on a single side of the display area AA is limited is solved. In addition, all the fan-out lines F and the chips may be in nearby connection, so as to effectively reduce space of the fan-out area, which is beneficial to achieving border narrowing.

Figure 4:
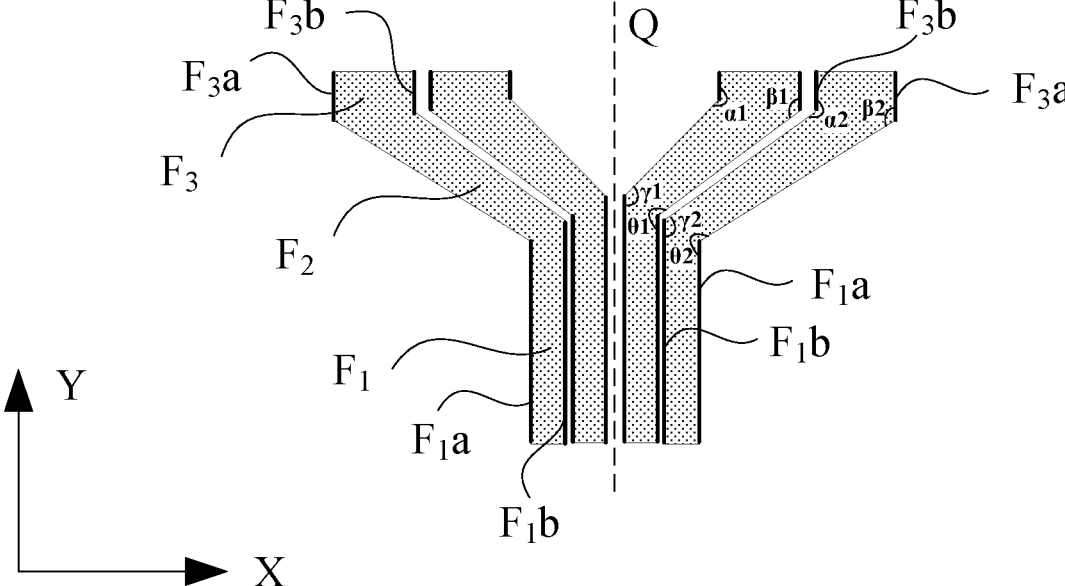
FIG. 4 is a schematic enlarged structural diagram of four fan-out lines arranged symmetrically with respect to a symmetric axis Q in FIG. 2.

In FIG. 2 to FIG. 4, taking the signal lines L in the display area AA being connected with the second chip IC2 through the fan-out lines F in the second fan-out area FA2 as an example, a specific line arrangement mode of the fan-out lines F is illustrated. When the signal lines L are connected with the third chip IC3 through the fan-out lines F, and the signal lines L are connected with the first chip IC1 through the fan-out lines F, the fan-out lines F may be designed with reference to FIG. 2 and FIG. 4.

Referring to FIG. 2 and FIG. 3, the second binding area BA2 may further include a plurality of binding electrodes PD, the binding electrodes PD are in binding connection with the second chip IC2, in some embodiments, the binding electrodes PD may further be in binding connection with elements such as a flexible circuit board, etc., therefore, the quantity and sizes of the binding electrodes PD need to be matched with elements such as the second chip IC2 or the flexible circuit board, etc. in binding connection with the binding electrodes PD, and to ensure lightness, thinness and border narrowing of a whole apparatus, the sizes of the elements such as the second chip IC2 or the flexible circuit board and the like are generally smaller, and sizes of all the binding electrodes PD are smaller.

However, different from other electronic devices such as a liquid crystal display apparatus and a touch control apparatus, etc., in a micro light-emitting diode display apparatus, to ensure product performance, it needs to be ensured that the signal lines on the driving backplate have a certain line width, which needs to be 3.8 mm or even larger, and moreover, due to limited design space, the signal lines L cannot be directly connected with the corresponding binding electrodes PD. In the embodiment of the present disclosure, the fan-out lines F are arranged to connect the signal lines L with the corresponding binding electrodes PD, the line width $d_1$ of at least one fan-out line F at the first end a is less than a line width $d_2$ of at least one fan-out line F at the second end b, at least one fan-out line F includes a first straight-line part $F_1$ and an oblique line part $F_2$, a certain included angle exists between an extension direction of the oblique line part $F_2$ and the first direction Y, and therefore the space in the driving backplate may be reasonably used for enabling the signal lines L to be able to connect with the corresponding binding electrodes 30. The area of the fan-out area may be reduced by adopting an above connection mode in the embodiment of the present disclosure, which is more beneficial to narrow border design.

It should be illustrated that in the embodiment of the present disclosure, the line width of the above fan-out line F may be understood as the width of the fan-out line F perpendicular to its extension direction.

In specific implementation, the quantity of binding electrodes PD connected with each signal line L may be determined according to the width of the second binding area BA2, the quantity of signal lines L in the driving back plate, etc., in FIG. 3, taking one signal line L being connected with one binding electrode PD as an example for illustration, during specific implementation, one signal line L may also be connected with the plurality of binding electrodes PD, and a corresponding relation of the signal lines L and the binding electrodes PD is not limited herein.

In the embodiment of the present disclosure, the line width $d_1$ of at least one fan-out line F at the first end a is less than the line width $d_2$ of at least one fan-out line F at the second end b, for example, in a direction of the first end a of the fan-out line F pointing to the second end b of the fan-out line F, the line width of at least one fan-out line F has a tendency of gradually increasing, it should be illustrated here that the line width of the fan-out line F may be gradually increased from the first end a to the second end b; or the line width of a certain part in a fan-out line F is gradually increased, and the line width of the rest part of the fan-out line may be unchangeable, as long as the line width of the fan-out line F have a tendency of gradually increasing as a whole.

In specific implementation, in the driving backplate provided by the embodiment of the present disclosure, as shown in FIG. 3, in the direction of the first end a of the fan-out line F pointing to the second end b of the fan-out line F, the line width of the oblique line part $F_2$ perpendicular to its extension direction gradually increases, and the line width of the oblique line part $F_2$ is greater than or equal to the line width of the first straight-line part $F_1$. In other words, in the direction of the second end b of the fan-out line F pointing to the first end a of the fan-out line F, the line width of the oblique line part $F_2$ gradually narrows, moreover, a certain included angle exists between the extension directions of the oblique line part $F_2$ and the first direction Y, the oblique line part $F_2$ inclines towards the binding electrodes PD, therefore, the fan-out line F may be connected with the signal line L and the corresponding binding electrode PD, and the line arrangement space of the driving backplate is fully used.

Optionally, in the driving backplate provided by the embodiment of the present disclosure, as shown in FIG. 3, the first straight-line part $F_1$ of at least one fan-out line F includes two sub side edges (as shown by $F_1a$ and $F_1b$ in FIG. 3) in the first direction Y, and a width of a portion of the first straight-line part $F_1$ corresponding to an overlap area of projections of two sub side edges in the first direction Y respectively is consistent in a direction perpendicular to the first direction Y. The first straight-line part $F_1$ extending in the first direction Y is arranged in the fan-out line F, which may achieve connection of the fan-out line F and the binding electrodes PD, moreover, the width of the portion of the first straight-line part $F_1$ corresponding to the overlap area of the projections of two sub side edges in the first direction Y respectively is consistent in the direction perpendicular to the first direction Y, so as to obtain the first straight-line part $F_1$ matched with the width of the corresponding binding electrode and meeting the requirement of the spacing between the adjacent connecting lines, which may avoid a short circuit or signal crosstalk happening in the adjacent connecting lines.

It should be illustrated that in the embodiment of the present disclosure, the line width of the portion of the first straight-line part $F_1$ corresponding to the overlap area of the projections of two sub side edges in the first direction Y respectively is consistent in a direction perpendicular to the first direction Y, and it may be understood that a difference between line widths at all positions of the portion of the first straight-line part $F_1$ is less than a set value, and in other words, the line widths at all positions of the portion of the first straight-line part $F_1$ are approximately identical.

In an actual application, in the driving backplate provided by the embodiment of the present disclosure, as shown in FIG. 2 and FIG. 3, in the second direction X, lengths of all the first straight-line parts $F_1$ in the first direction Y have a tendency of increasing, and then decreasing; and the second direction X is a direction perpendicular to the first direction Y. As shown in FIG. 2, part of straight lines, connected with the second binding area BA2, in the fan-out lines F in the figure are the first straight-line parts $F_1$, it may be obviously seen from FIG. 2 that in the second direction X, that is, a direction from left to right in the figure, lengths of the first straight-line parts $F_1$ in the first direction Y have a tendency of increasing and then decreasing, that is to say, in the plurality of fan-out lines F in the driving backplate, lengths of first straight-line parts $F_1$ corresponding to a middle position of the second chip IC2 is larger, lengths first straight-line parts F1 corresponding to positions on two sides of the second chip IC2 are smaller, and therefore, the space of the second fan-out area FA2 may be more reasonably used for enabling the signal lines L to be able to achieve connection with the corresponding binding electrodes PD.

In the plurality of signal lines L in the driving backplate, the signal line L at the middle position of the second chip IC2 is proximate to the second chip IC2, therefore, the oblique line parts $F_2$ contained in the fan-out lines F connected with the signal line L at the middle position of the second chip IC2 may be shorter, the signal lines L at positions on the two sides of the second chip IC2 are far away from the second chip IC2, therefore, the oblique line parts $F_2$ contained in the fan-out lines F connected with the signal lines F at the positions on the two sides of the second chip IC2 need to be longer, therefore, the lengths of the first straight-line parts $F_1$ at the middle position are arranged to be larger, the lengths of the first straight-line parts $F_1$ at the positions on the two sides of the second chip IC2 are arranged to be smaller, and a space of the second fan-out area FA2 may be more reasonably used.

Furthermore, in the driving backplate provided by the embodiment of the present disclosure, as shown in FIG. 2, in the second direction X, the lengths of all the first straight-line parts $F_1$ in the first direction Y are symmetrically distributed along a symmetric axis Q of the second chip IC2 in the first direction Y, therefore, the space of the second fan-out area FA2 may be more reasonably used, line arrangement design in the second fan-out area FA2 is conveniently performed, and all the fan-out lines F in the second fan-out area FA2 can meet a circuit arrangement requirement.

It should be illustrated that in the embodiment of the present disclosure, referring to FIG. 3, the lengths of the first straight-line parts $F_1$ in the first direction Y may be understood as: a length of the portion of the first straight-line part $F_1$ corresponding to the overlap area of the projections of two sub side edges $F_1a$ and $F_1b$ in the first direction Y respectively is main, that is, lengths of areas with consistent line widths in the first straight-line part $F_1$ are main.

FIG. 4 is a local enlarged schematic diagram of four connecting lines symmetrically arranged with respect to the symmetric axis Q in FIG. 2, as shown in FIG. 4, in the driving backplate provided by the embodiment of the present disclosure, on a side of the symmetric axis Q, a length of one sub side edge in two sub side edges of each first straight-line part $F_1$ proximate to the symmetric axis Q is greater than or equal to a length of the other sub side edge, in FIG. 4, taking the sub side edge proximate to the symmetric axis Q being $F_1b$ and the sub side edge away from the symmetric axis Q being $F_1a$ as an example for illustration, that is, the length of the sub side edge $F_1b$ in each first straight-line part $F_1$ is greater than the length of the sub side edge $F_1a$ in the first straight-line part $F_1$, and in any two first straight-line parts $F_1$ arranged in the second direction X, any one in two sub side edges of one first straight-line part $F_1$ more proximate to the symmetric axis Q is greater than or equal to any one in two sub side edges of the other first straight-line part $F_1$. For example, in FIG. 4, in one aspect, in two first straight-line parts $F_1$ on a left side of the symmetric axis Q, the lengths of two sub side edges of the first straight-line part $F_1$ more proximate to the symmetric axis Q are greater than the lengths of two sub side edges of the other first straight-line part. Through this arrangement, the first straight-line parts $F_1$ with smaller widths may be acquired so as to meet the requirement of the spacing between the adjacent fan-out lines F, and prevent signal crosstalk generated between the adjacent signal lines L. In the other aspect, a larger one in two included angles between the sub side edge $F_1a$ of each first straight-line part $F_1$ and a side edge of the oblique line part $F_2$ connected with the first straight-line part $F_1$ is a first included angle, and a smaller one of two included angles between the sub side edge $F_1b$ and the side edge of the oblique line part $F_2$ connected with the first straight-line part $F_1$ is a second included angle, thus on one side of the symmetric axis Q, the larger the distance between the first straight-line parts $F_1$ and the symmetric axis Q is, the larger the first included angle is and the smaller the second included angle is, for example, in FIG. 4, in two adjacent fan-out lines F on a right side of the symmetric axis Q, the first included angle θ1 is less than the first included angle θ2, and the second included angle γ1 is greater than the second included angle γ2.

Furthermore, in the driving backplate provided by the embodiment of the present disclosure, as shown in FIG. 2 and FIG. 3, at least one in the plurality of fan-out lines F may further include: a second straight-line part $F_3$ extending in the first direction Y; the oblique line part $F_2$ is connected with the signal line L through the second straight-line part $F_3$; and the line width of the second straight-line part $F_3$ is greater than or equal to the line width of the oblique line part $F_2$.

In the embodiment of the present disclosure, the second straight-line parts $F_3$ are arranged, the lengths and an oblique degree of the oblique line parts $F_2$ in all the fan-out lines F may be adjusted, so that all the signal lines L may be connected with the corresponding binding electrodes PD through the fan-out lines F, moreover, a certain distance is kept between all the fan-out lines F, a short circuit happening in the adjacent fan-out lines F is avoided, space may be more reasonably used, and space occupied by the second fan-out area FA2 in the first direction Y is smaller, which is more beneficial to narrow border design.

In the specific implementation, in the driving backplate provided by the embodiment of the present disclosure, as shown in FIG. 3, the second straight-line part $F_3$ of at least one fan-out line F includes two sub side edges (shown as $F_3a$ and $F_3b$ in FIG. 3) in the first direction Y, a width of a portion of the second straight-line part $F_3$ corresponding to an overlap area of projections of two sub side edges in the first direction Y respectively is consistent in a direction perpendicular to the first direction Y, and therefore, a short circuit happening in the adjacent fan-out lines F may be avoided.

It should be illustrated that in the embodiment of the present disclosure, the width of the portion of the second straight-line part $F_3$ corresponding to the overlap area of the projections of two sub side edges in the first direction Y respectively is consistent in a direction perpendicular to the first direction Y, and it may be understood that a difference between line widths at all positions of the portion of the second straight-line part $F_3$ is less than a set value, in other words, the line widths at all the positions of the portion of the second straight-line part $F_3$ are proximately identical.

In an actual application, in the driving backplate provided by the embodiment of the present disclosure, as shown in FIG. 2 and FIG. 3, in the second direction X, lengths of all the second straight-line parts $F_3$ in the first direction Y have a tendency of decreasing and then increasing; and the second direction X is a direction perpendicular to the first direction Y. As shown in FIG. 2, part of straight lines in the fan-out lines F connected with the signal lines L in the figure are the second straight-line parts $F_3$, it may be obviously seen from FIG. 2 that in the second direction X, that is, a direction from left to right in the figure, lengths of the second straight-line parts $F_3$ in the first direction Y have a tendency of decreasing and then increasing, that is to say, in the plurality of fan-out lines F in the driving backplate, a length of the second straight-line part $F_3$ at the middle position of the second chip IC2 is smaller, lengths of the second straight-line parts $F_3$ at positions on two sides of the second chip IC2 are larger, and therefore, the space of the second fan-out area FA2 may be more reasonably used for enabling the signal lines L to be able to achieve connection with the corresponding binding electrodes PD.

In the plurality of signal lines L in the driving backplate, the signal line L at the middle position of the second chip IC2 is proximate to the second chip IC2, therefore, the oblique line parts $F_2$ contained in the fan-out lines F connected with the signal lines L at the middle position of the second chip IC2 may be shorter, the signal lines L at positions on two sides of the second chip IC2 are far away from the second chip IC2, therefore, the oblique line parts $F_2$ of the fan-out lines F connected with the signal lines F at positions on two sides of the second chip IC2 need to be longer, in the embodiment of the present disclosure, the lengths of the first straight-line parts $F_1$ at the middle position are arranged to be larger, the lengths of the first straight-line parts $F_1$ at positions on two sides of the second chip IC2 are arranged to be smaller, moreover, the length of the second straight-line part $F_3$ at the middle position is arranged to be smaller, the lengths of the second straight-line parts $F_3$ at the positions on the two sides are arranged to be larger, therefore, the lengths and an oblique degree of the oblique line parts $F_2$ in the fan-out lines F may be adjusted, and the signal lines L may be connected with the corresponding binding electrodes PD through the fan-out lines F, and space of the second fan-out area FA2 may be more reasonably used.

Furthermore, in the driving backplate provided by the embodiment of the present disclosure, as shown in FIG. 2, in the second direction X, the lengths of all the second straight-line parts $F_3$ in the first direction Y are symmetrically distributed along the symmetric axis Q of the second chip IC2 in the first direction Y, therefore, the space of the second fan-out area FA2 may be more reasonably used, line arrangement design in the second fan-out area FA2 is conveniently performed, and all the fan-out lines F in the second fan-out area FA2 can meet a circuit arrangement requirement.

It should be illustrated that in the embodiment of the present disclosure, referring to FIG. 3, the length of the second straight-line part $F_3$ in the first direction Y may be understood as: a length of the portion of the second straight-line part $F_3$ corresponding to the overlap area of the projections of two sub side edges $F_3a$ and $F_3b$ in the first direction Y respectively is main, that is, lengths of areas with consistent line widths in the second straight-line part $F_3$ are main.

As shown in FIG. 4, taking four connecting lines symmetrically arranged with respect to the symmetric axis Q as an example, in the driving backplate provided by the embodiment of the present disclosure, on a side of the symmetric axis Q, a length of one sub side edge in two sub side edges of each second straight-line part $F_3$ proximate to the symmetric axis Q is less than or equal to a length of the other sub side edge, in FIG. 4, taking the sub side edge proximate to the symmetric axis Q being $F_3b$ and the sub side edge away from the symmetric axis Q being $F_3a$ as an example for illustration, that is, the length of the sub side edge $F_3b$ in each second straight-line part $F_3$ is less than the length of the sub side edge $F_3a$ in the second straight-line part $F_3$, and in any two second straight-line parts $F_3$ arranged in the second direction X, any one in two sub side edges of one second straight-line part $F_3$ more proximate to the symmetric axis Q is less than or equal to any one of two sub side edges of the other second straight-line part $F_3$. For example, in FIG. 4, in one aspect, in two second straight-line parts $F_3$ on the left side of the symmetric axis Q, the lengths of two sub side edges of the second straight-line part $F_3$ more proximate to the symmetric axis Q are less than the lengths of two sub side edges of the other second straight-line part. Through this arrangement, the second straight-line parts with smaller widths may be acquired so as to meet the requirement of the spacing between the adjacent connecting lines and prevent signal crosstalk generated between the adjacent signal lines. In the other aspect, a smaller one in two included angles between the sub side edge $F_3a$ of each second straight-line part $F_3$ and a side edge of the oblique line part $F_2$ connected with the second straight-line part $F_3$ is a third included angle, and a larger one of two included angles between the sub side edge $F_3b$ and the side edge of the oblique line part $F_2$ connected with the second straight-line part $F_3$ is a fourth included angle, on one side of the symmetric axis Q, the larger the distance between the second straight-line parts 303 and the symmetric axis Q is, the smaller the third included angle is and the larger the fourth included angle is, for example, in FIG. 4, in two adjacent fan-out lines F on the right side of the symmetric axis Q, the third included angle β1 is greater than the third included angle θ2, and the fourth included angle α1 is less than the fourth included angle α2.

In an actual application, in the driving backplate provided by the embodiment of the present disclosure, as shown in FIG. 2 and FIG. 3, the signal lines L are connected with all the corresponding binding electrodes PD through the fan-out lines F, the line widths $d_2$ of the fan-out lines F at the second ends b are arranged to be consistent with the line widths of the signal lines L, the line widths of the fan-out lines F may be larger in a case that the line arrangement difficulty is not increased, so that resistances of the fan-out lines F are smaller, and good product performance of the driving backplate is ensured. It should be illustrated that in the embodiment of the present disclosure, consistency of the line widths of the fan-out lines F at the second ends b with the line widths of the signal lines L refers to that differences between the line widths of the fan-out lines F at the second ends b and the line widths of the signal lines L are less than the set value, that is, the line widths of the fan-out lines F at the second ends b are approximately equal to the line widths of the signal lines L.

In addition, in the embodiments of the present disclosure, consistency of the line widths $d_2$ of the fan-out lines F at the second ends b with the line widths of the signal lines L is used for illustration, in the specific implementation, the line widths $d_2$ of the fan-out lines F at the second ends b may also be greater than or equal to the line widths of the signal lines L, and as only as the circuit design requirement in the driving backplate can be met, the line widths of the connecting lines are not limited herein.

Moreover, the line widths $d_1$ of the fan-out lines F at the first ends a are set to be greater than the widths of the correspondingly-connected binding electrodes PD, in order to ensure the product performance, the minimum widths of the fan-out lines F need to be greater than a set threshold value, the sizes of the binding electrodes PD connected with the fan-out lines F are smaller, therefore, the line widths $d_1$ of the fan-out lines F at the first ends a may be set to be greater than the widths of the correspondingly-connected binding electrodes PD, and when a fan-out line F is correspondingly connected with the plurality of binding electrodes PD, the line width $d_1$ of the fan-out line F at the first end a may be greater than a sum of the total widths of the binding electrodes PD and gaps among the binding electrodes PD, for example, the signal line L is correspondingly connected with three binding electrodes PD through the fan-out line F, the line width of the fan-out line F at the first end a may be greater than the total widths of the three binding electrodes PD plus the gaps among the three binding electrodes PD. Therefore, the widths of the fan-out lines F may be further increased, and the resistances of the fan-out lines F are further reduced. It should be noted that the line widths of the fan-out lines F at the first ends a are greater than the widths of the correspondingly-connected binding electrodes PD, and meanwhile, it needs to ensure that a certain spacing is kept between the adjacent fan-out lines F, so as to prevent a short circuit between the adjacent fan-out lines F.

Specifically, in the driving backplate provided by the embodiment of the present disclosure, the line width of the signal line L is 20-130 times the line width of the binding electrode PD.

In the specific implementation, the line width of the binding electrode PD is about 70 μm, and the line width of the signal line L ranges from 1500 μm to 9000 μm. It is thus clear that in the micro light-emitting diode display apparatus, the difference between the line width of the signal line L and the line width of the binding electrode PD in the driving backplate is larger, and therefore the difficulty of line connection in the fan-out area is larger. In the embodiment of the present disclosure, the fan-out lines are arranged to achieve connection of the signal lines L and the corresponding binding electrodes PD, which solves the technical problem of the larger line connection difficulty of the fan-out area is solved.

Figure 5:
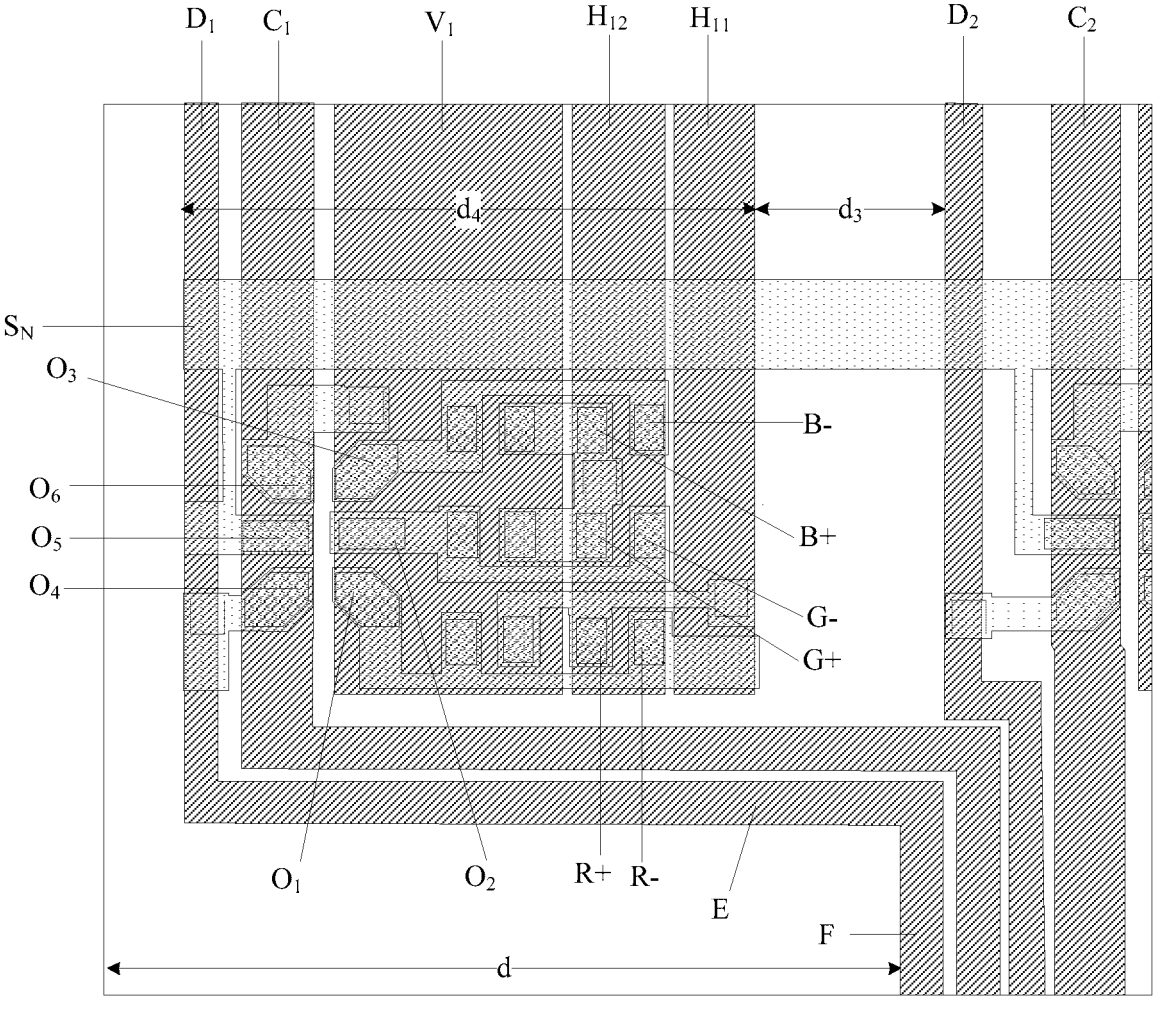
FIG. 5 is a schematic enlarged structural diagram of an area LD in FIG. 1.

Optionally, in a display substrate provided by an embodiment of the present disclosure, as shown in FIG. 5 and FIG.

6, the lengths of connecting lines E may be greater than or equal to a spacing distance $d_3$ between two adjacent pixel units P in the second direction X and less than or equal to a sum of a width $d_4$ of a single pixel unit column and the spacing distance $d_3$ between two adjacent pixel units P. It should be understood that if line arrangement space permits, the larger the lengths of the connecting lines E, the better, that is, a minimum distance between the signal line L on an outmost side or the fan-out line F on the outmost side and a side edge of the base substrate parallel to the first direction Y should be expanded to the maximum limit, and therefore a badness of line breaking caused by bending stress generated by a mechanical action is reduced.

Optionally, in the driving backplate provided by the embodiment of the present disclosure, as shown in FIG. 1, the signal lines L (for example, $C_1$, and $D_1$, etc.) connected with the fan-out lines F through the connecting lines E are connected with the pixel unit columns on the outmost sides, this arrangement facilitates line arrangement design, and a smaller line arrangement resistance may be ensured.

Optionally, in the driving backplate provided by the embodiment of the present disclosure, as shown in FIG. 1, when distances between line arrangement and boundaries on left and right sides of the base substrate are larger, a stress influence is smaller, and therefore at least one signal line L (for example, $H_{11}$, $H_{12}$ and $V_1$, etc.) may be arranged to be directly connected with at least one fan-out line F. In some embodiments, a minimum distance $d_5$ between the signal line L connected with at least one fan-out line F and the boundary on the left side of the base substrate may be 320 μm, and a minimum distance $d_6$ between the signal line L connected with at least one fan-out line F and the boundary of the right side of the base substrate may be 175 μm, as shown in FIG. 1.

Optionally, in the above driving backplate provided by the embodiment of the present disclosure, the fan-out area (for example, the first fan-out area FA1 and/or the second fan-out area FA2) may be folded to the opposite side of the display side of the driving backplate, and in this case, a minimum distance d' between the connecting line E and a bending axis K in the first direction Y may be set to be larger than 150 μm, as shown in FIG. 1.

After the fan-out area is folded to a reverse side of the driving backplate based on the bending axis K, a plurality of display side plates are spliced. The minimum distance d' between the connecting line E and the bending axis K in the first direction Y is set to be larger than 150 μm, which may effectively avoid badness caused by splicing stress, etc. due to a too small distance between the connecting line E and the bending axis K when a boundary at the bending axis K serves as a splicing boundary in a subsequent splicing process. In some embodiments, the connecting lines E may be located in the display area AA, and therefore, the connecting lines E may completely avoid areas required to be bent, so that influences of the bending stress on the connecting lines E are reduced.

Figure 6:
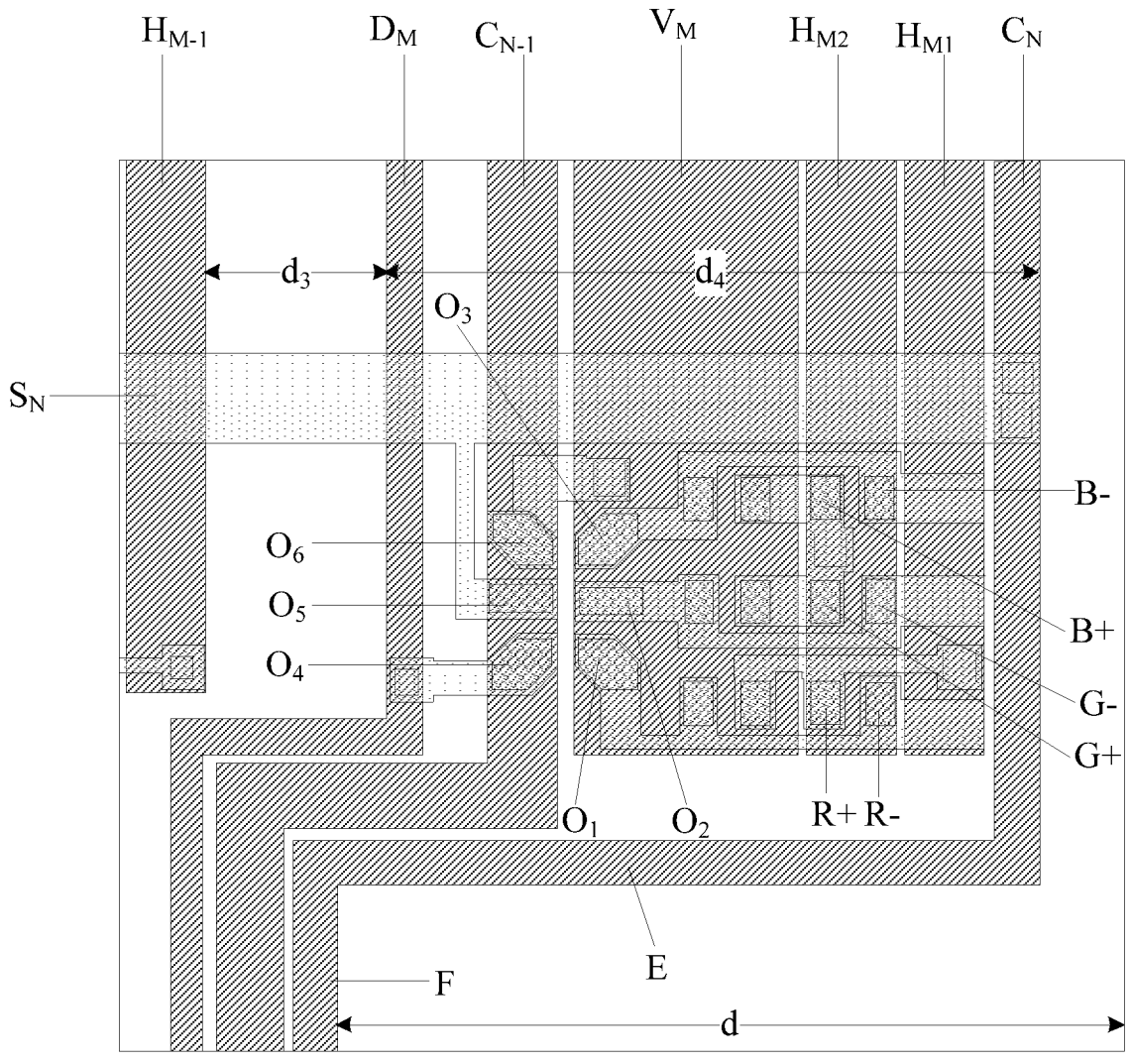
FIG. 6 is a schematic enlarged structural diagram of an area RD in FIG. 1.

Optionally, in the above driving backplate provided by the embodiment of the present disclosure, in order to reduce influences of bending stress, splicing stress, etc. as much as possible, as shown in FIG. 1, FIG. 5 and FIG. 6, a minimum distance d between the fan-out lines F and the boundaries (that is, the left and right boundaries) of the base substrate may be greater than 1000 μm. In some embodiments, the distance d may be equal to 1250 μm.

Optionally, in the above driving backplate provided by the embodiment of the present disclosure, in order to avoid a short circuit or signal crosstalk of adjacent line arrangement, a gap between two adjacent signal lines L in the second direction X and a gap between two adjacent connecting lines E in the first direction Y may be respectively set to be greater than 100 μm.

Although the signal lines in the second fan-out area FA2 in FIG. 1 are not particularly designed, it may be understood that according to an invention conception, the signal lines connected with the first pixel unit column and the $M^{th}$ pixel unit column are narrowed towards an inner side of the driving backplate through the connecting lines extending in the second direction X, and then are connected with the fan-out lines in the second fan-out area FA2, and the reliability of the driving backplate is further improved.

In some embodiments, as shown in FIG. 1 and FIG. 7 to FIG. 9, the plurality of signal lines L may include a plurality of data signal lines $D_m$, a plurality of reference signal lines $V_m$, a plurality of positive signal lines $H_{m1}$ and $H_{m2}$ and a plurality of transfer signal lines $C_n$ which extend in the first direction Y, m is an integer greater than or equal to 1 and less than or equal to M, and M is a sum of the pixel unit columns; n is an integer greater than or equal to 1 and less than or equal to N, and N is a sum of the pixel unit rows; and in the present disclosure, a plurality of scanning signal lines $S_n$ may further be arranged, and all the scanning signal lines $S_n$ extend between all the pixel unit rows in the second direction X; and each pixel unit column is correspondingly connected with one data signal line $D_m$, one reference signal line $V_m$ and one positive signal line $H_{m1}$, each transfer signal line $C_n$ is correspondingly connected with one pixel unit row through one scanning signal line $S_n$, therefore, a scanning signal may be provided for the corresponding scanning signal line $S_n$ through the transfer signal line $C_n$, so that signal sources configured to provide the scanning signal may be arranged at two ends of the transfer signal line $C_n$, and arrangement of chips configured to provide the scanning signals at two ends of the scanning signal line $S_n$ is avoided.

Figure 7:
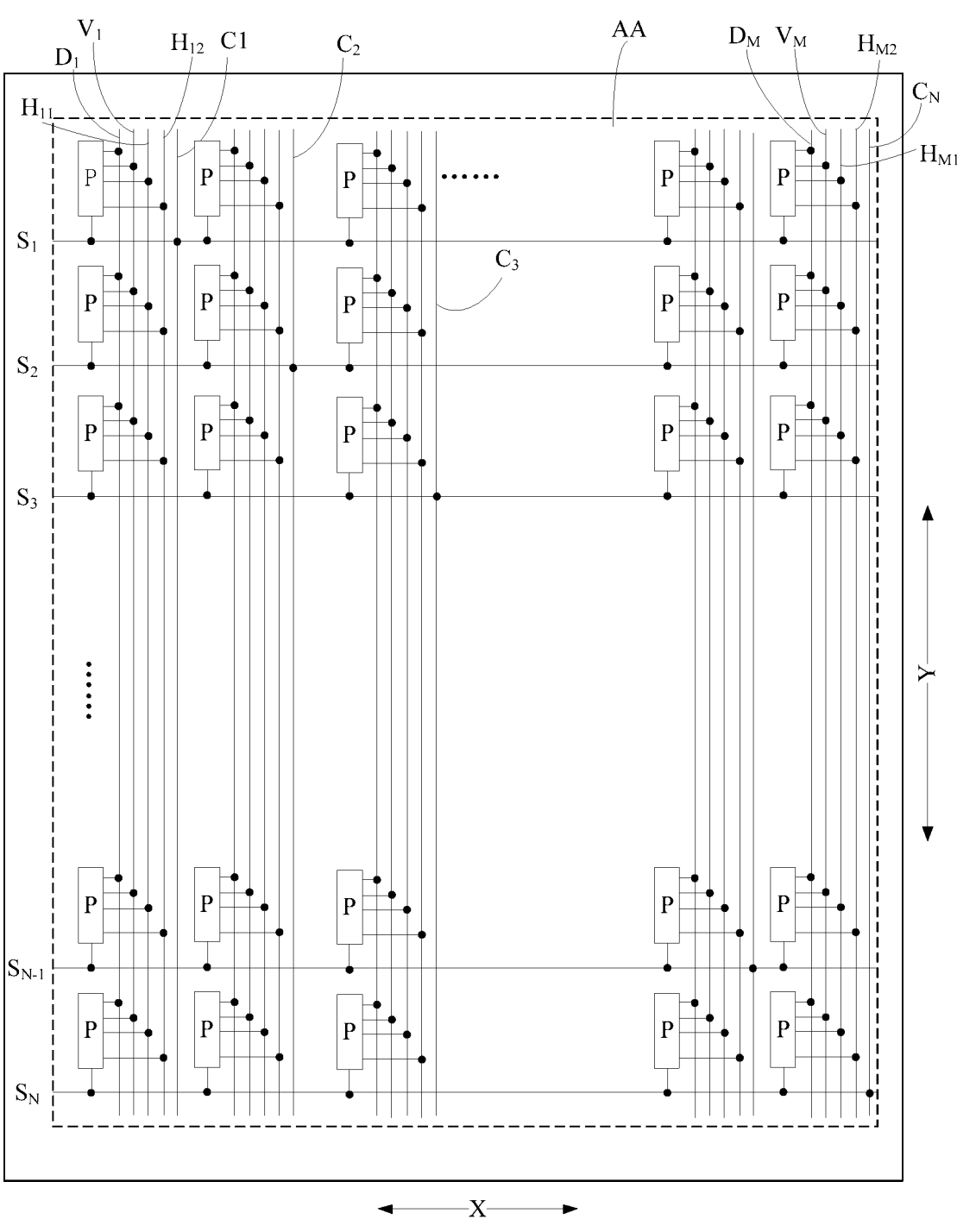
FIG. 7 is yet another schematic structural diagram of a driving backplate provided by an embodiment of the present disclosure.

In some embodiments, as shown in FIG. 1 and FIG. 7, when the quantity N of the pixel unit rows in the display area AA is the same as the quantity M of the pixel unit columns in the display area AA, that is, in a case that N=M, a side of each pixel unit column is correspondingly provided with one transfer signal line $C_n$, and only one transfer signal line $C_n$ is arranged between every two adjacent pixel unit columns, for example, a right side of a second column of pixels is provided with the transfer signal line $C_2$ correspondingly electrically connected with the scanning signal line $S_2$.

Figure 8:
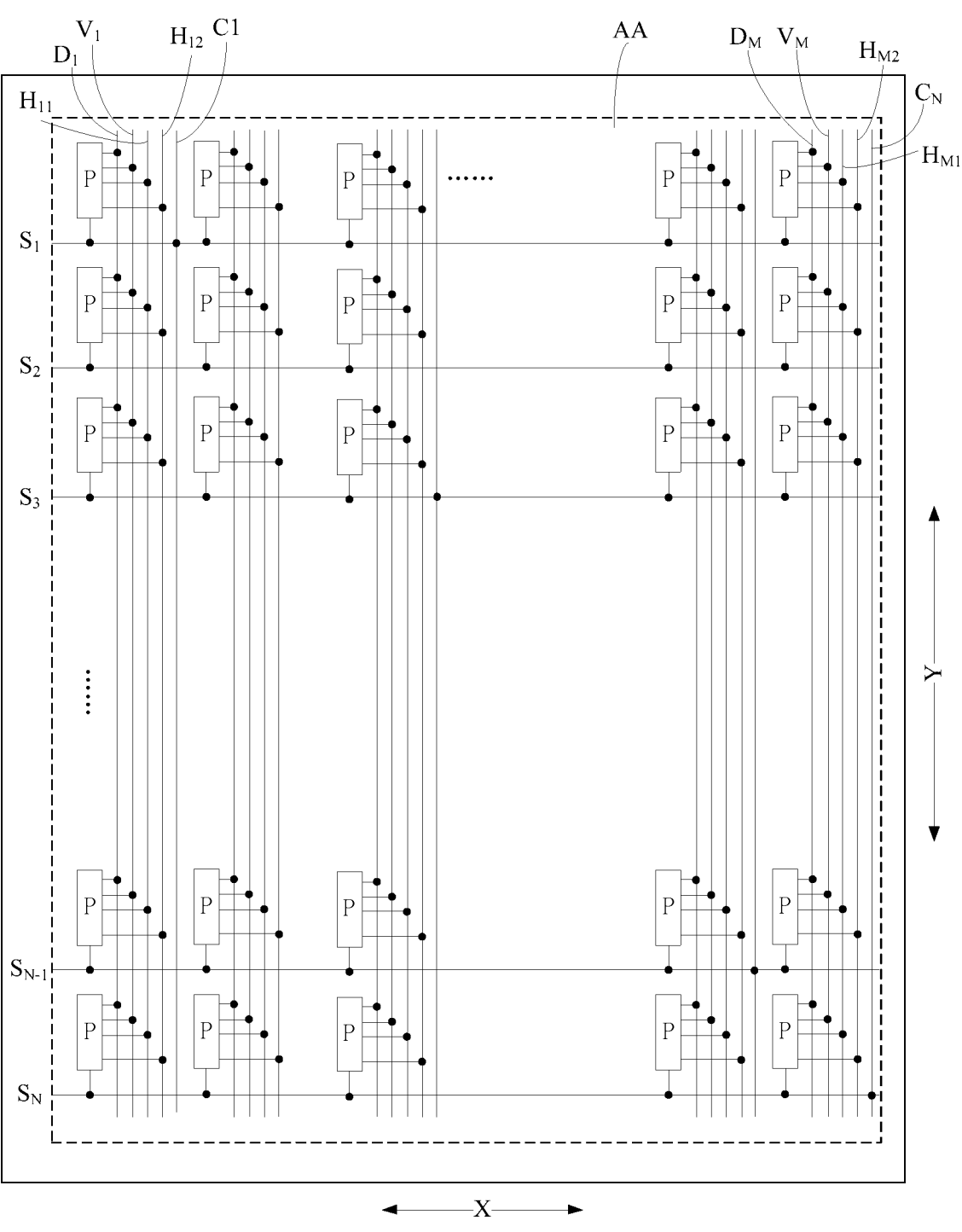
FIG. 8 is yet another schematic structural diagram of a driving backplate provided by an embodiment of the present disclosure.

In some embodiments, as shown in FIG. 8, when the quantity N of the pixel unit rows in the display area AA is less than the quantity M of the pixel unit columns in the display area AA, that is, in a case that N<M, a side of each of some pixel unit columns is correspondingly provided with one transfer signal line $C_n$, and the quantity of these pixel unit columns is N; a side of each of some other pixel unit columns is provided with no transfer signal line $C_n$, the quantity of these pixel unit columns is (M-N), and at this time, the transfer signal line $C_n$ does not exist between two adjacent pixel unit columns in these pixel unit columns. For example, a right side of the second column of pixels is not provided with the transfer signal line $C_n$, and the transfer signal line $C_2$ correspondingly electrically connected with the scanning signal line $S_2$ is arranged on a side of another pixel unit column.

Figure 9:
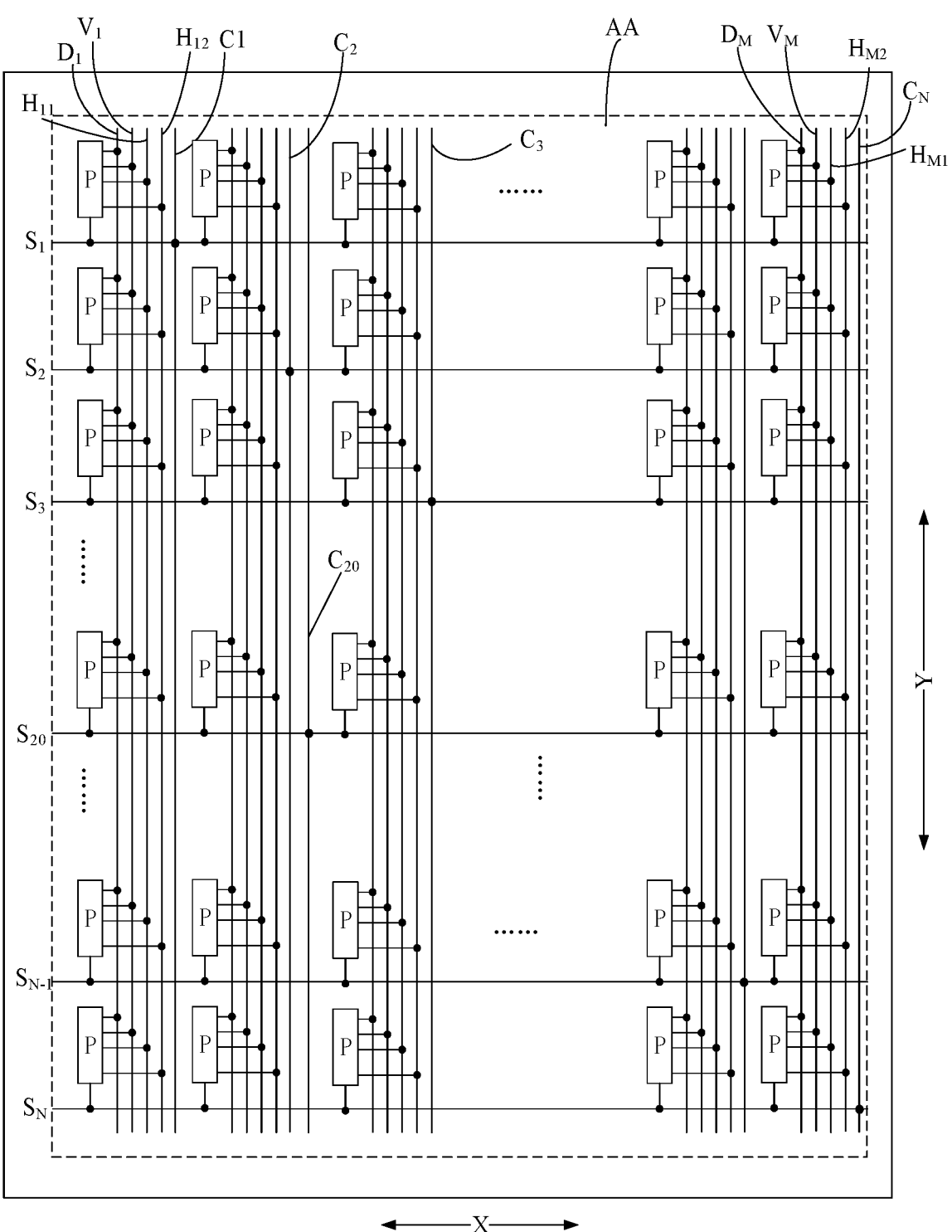
FIG. 9 is yet another schematic structural diagram of a driving backplate provided by an embodiment of the present disclosure.

In some embodiments, as shown in FIG. 9, when the quantity N of the pixel unit rows in the display area AA is greater than the quantity M of the pixel unit columns in the display area AA, that is, in a case that N>M, a side of each pixel unit column is correspondingly provided with at least one transfer signal line $C_n$, a side of each of some pixel unit columns is correspondingly provided with one transfer signal line $C_n$, a side of each of some other pixel unit columns is provided with not one transfer signal line $C_n$, and two transfer signal lines $C_n$ are arranged between certain two adjacent pixel unit columns. For example, the right side of the second column of pixels is provided with the transfer signal line $C_2$ correspondingly electrically connected with the scanning signal line $S_2$ and the transfer signal line $C_{20}$ correspondingly electrically connected with the scanning signal line $S_{20}$.

Specifically, an example shown in FIG. 1 is used to illustrate arrangement of the connecting lines E in the present disclosure. In FIG. 1, a distance between the boundary of the base substrate and the data signal line $D_m$ corresponding to each pixel unit column, a distance between the boundary of the base substrate and the reference signal line $V_m$ corresponding to each pixel unit column and a distance between the boundary of the base substrate and the positive signal line $H_m$ corresponding to each pixel unit column are sequentially increased. The plurality of pixel units P form M pixel unit columns sequentially arranged in the second direction X, two pixel unit columns on outmost sides are respectively the first pixel unit column and the $M^{th}$ pixel unit column. Moreover, in the second direction X, a distance between the data signal line $D_m$ corresponding to the first pixel unit column and a boundary of the base substrate is less than a distance between the data signal line $D_m$ corresponding to the $M^{th}$ pixel unit column and a boundary of the base substrate, in other words, in FIG. 1, the M pixel unit columns are arranged in the second direction X, the M pixel unit columns include the $m^{th}$ pixel unit column, $1 \leq m \leq M$, and m is an integer. The data signal lines $D_1$, $D_2$ and $D_M$ corresponding to the first pixel unit column, the second pixel unit column and the $M^{th}$ pixel unit column respectively are connected with the fan-out lines F in the first fan-out area FA1 through the connecting lines E. The data signal lines $D_3$ to $D_{M-1}$ corresponding to the third pixel unit column to the $(M-1)^{th}$ pixel unit column respectively are directly connected with the fan-out lines F in the first fan-out area FA1. The plurality of reference signal lines $V_1$ to $V_M$ and the plurality of positive signal lines $H_{11}$ to $H_{M1}$ and $H_{12}$ to $H_{M2}$ are directly connected with the fan-out lines F in the second fan-out area FA2.

The data signal lines $D_1$, $D_2$ and $D_M$ proximate to the boundaries of the base substrate are connected with the fan-out lines F through the connecting lines E, so that the distances between the fan-out lines F and the boundaries of the base substrate are increased, and therefore a badness of line breaking caused by a mechanical action of the fan-out lines F may be effectively reduced.

Continuously referring to FIG. 1, the transfer signal lines $C_n$ may be specifically located between the data signal line $D_m$ and the reference signal line $V_m$ corresponding to each pixel unit column and between the $M^{th}$ pixel unit column and the boundary of the base substrate. The transfer signal line $C_1$ between the data signal line $D_1$ and the reference signal line $V_1$ corresponding to the first pixel unit column, the transfer signal line $C_{N-1}$ between the data signal line $D_M$ and the reference signal line $V_m$ corresponding to the $M^{th}$ pixel unit column and the transfer signal line $C_N$ between the $M^{th}$ pixel unit column and the boundary of the base substrate are connected with the fan-out lines F in the first fan-out area FA1 through the connecting lines E. The transfer signal lines $C_3$ to $C_{N-2}$ between the data signal lines and the reference signal lines corresponding to the third pixel unit column to the $(M-1)^{th}$ pixel unit column respectively are directly connected with the fan-out lines F in the first fan-out area FA1.

The transfer signal lines $C_1$, $C_{N-1}$ and $C_N$ near the boundaries of the base substrate are connected with the fan-out lines F through the connecting lines E, so that the distances between the fan-out lines F and the boundaries of the base substrate are increased, and therefore a badness of line breaking caused by the mechanical action of the fan-out lines F may be effectively reduced.

Optionally, the above driving backplate provided by the embodiment of the present disclosure may include a first conducting layer and a second conducting layer which are sequentially arranged on the base substrate and are insulated from each other; and in some embodiments, the data signal lines $D_m$, the reference signal lines $V_m$, the positive signal lines $H_{m1}$ and $H_{m2}$ and the transfer signal lines $C_n$ extending in the first direction Y may be arranged in the first conducting layer, and the scanning signal lines $S_n$ extending in the second direction X are arranged in the second conducting layer, so as to achieve reasonable line arrangement.

Figure 10:
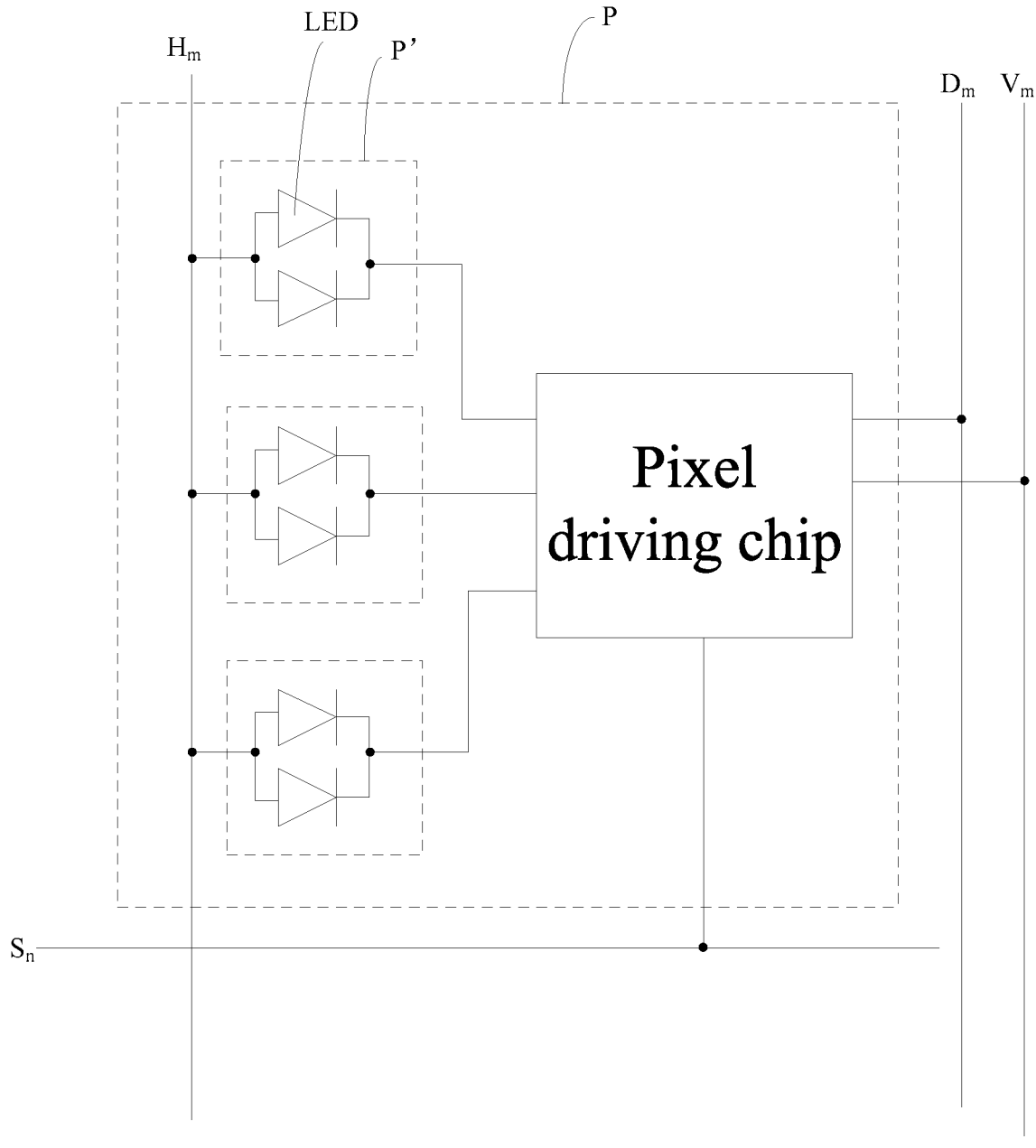
FIG. 10 is a schematic structural diagram of one pixel unit P in FIG. 1.

In addition, the driving backplate may further include a third conducting layer, the third conducting layer is located on a side of the second conducting layer away from the base substrate, and an insulation layer exists between the second conducting layer and the third conducting layer. In some embodiments, the third conducting layer includes a pixel driving chip and a plurality of pins, and the plurality of pins are in binding connection with inorganic light-emitting diodes of different colors subsequently. Specifically, as shown in FIG. 5 and FIG. 6, the pixel driving chip is provided with a first signal end $O_1$, a second signal end $O_2$, a third signal end $O_3$, a fourth signal end $O_4$, a fifth signal end $O_5$ and a sixth signal end $O_6$. The first signal end $O_1$ is connected with a pin corresponding to a negative electrode R– of the first-color inorganic light-emitting diode, the second signal end $O_2$ of the pixel driving chip is connected with a pin corresponding to a negative electrode G– of the second-color inorganic light-emitting diode, the third signal end $O_3$ of the pixel driving chip is connected with a pin corresponding to a negative electrode B– of the third-color inorganic light-emitting diode, the fourth signal end $O_4$ of the pixel driving chip is connected with the data signal line $D_n$, the fifth signal end $O_5$ of the pixel driving chip is connected with the scanning signal line $S_n$, the sixth signal end $O_6$ of the pixel driving chip is connected with the reference signal line $V_m$, a pin corresponding to a positive electrode R+ of the first-color inorganic light-emitting diode is connected with the positive signal line $H_{m1}$, a pin corresponding to a positive electrode G+ of the second-color inorganic light-emitting diode is connected with the positive signal line $H_{m2}$, and a pin corresponding to a positive electrode B+ of the third-color inorganic light-emitting diode is connected with the positive signal line $H_{m2}$. In some embodiments, as shown in FIG. 10, each pixel unit P may include sub pixels P' of at least three colors, and the above pixel driving chips driving the sub pixels P' to emit light. Each sub pixel P' includes at least one LED, and the LED, for example, may be a micro inorganic light-emitting diode. In some embodiments, each pixel unit P may include three sub pixels P', each sub pixel P' includes one or two LEDs. Specifically, FIG. 10 shows that each sub pixel P' includes two LEDs, six LEDs contained in one pixel unit P are arranged in three rows and two columns, and the three rows of LEDs may be a first-color light-emitting device R, a second-color light-emitting device G and a third-color light-emitting device B from bottom to top in sequence.

The first-color light-emitting device R may be the above first-color inorganic light-emitting diode, the second-color light-emitting device G may be the above second-color inorganic light-emitting diode, the third-color light-emitting device B may be the above third-color inorganic light-emitting diode, and moreover, the light-emitting devices are correspondingly connected with the pins through the above mode. It should be illustrated that when each sub pixel P' includes one LED, in every two pairs of pins arranged corresponding to the first-color inorganic light-emitting diode, the second-color inorganic light-emitting diode and the third-color inorganic light-emitting diode respectively, only one pair of pins bind the inorganic light-emitting diodes of the corresponding colors, and the other pair of pins are in standby application.

In addition, in FIG. 10, the reference signal line $V_m$ is configured to provide a negative signal for the pixel driving chip, the pixel driving chip is configured to be enabled under control of the scanning signal line $S_n$, so as to receive a signal transmitted by the data signal line $D_m$, and therefore the pixel driving chip and the sub pixels P' of different colors form a current path between the positive signal line $H_{m1}$ or $H_{m2}$ and the reference signal line $V_m$ in different time durations, and therefore light emitting of the corresponding sub pixels P' is achieved.

In another aspect, an embodiment of the present disclosure provides a display panel including the driving backplate provided by the embodiment of the present disclosure and a plurality of micro light-emitting diodes electrically connected with the driving backplate. Since a principle of solving problems by the display panel is similar to a principle of solving problems by the driving backplate, implementation of the driving panel may refer to the embodiment of the driving backplate, and repetition is omitted.

In another aspect, an embodiment of the present disclosure provides a display apparatus, including a plurality of display panels provided by the embodiment of the present disclosure, and the plurality of display panels are arranged in a splicing mode. Since a principle of solving problems by the display apparatus is similar to the principle of solving problems by the display panels, implementation of the display apparatus may refer to the embodiment of the display panels, and repetition is omitted.

In some embodiments, the display apparatus includes, but is not limited to, a radio frequency unit, a network module, an audio output unit, an input unit, a sensor, a display unit, a user input unit, an interface unit, a memory, a processor, a power supply and other components. Those skilled in the art may understand that a structure of the above display apparatus does not form limitation to the above display apparatus, and the display apparatus may include above more or less components, or a combination of some components, or arrangement of different components. In the embodiment of the present disclosure, the display apparatus includes, but is not limited to, a display, a mobile phone, a tablet personal computer, a television, a wearable electronic device, a notebook computer, a digital photo frame, a navigator, a smart watch, a fitness wristband, a personal digital assistant and any other products or components with display functions.

Apparently, those skilled in the art may perform various alterations and variations to the embodiments of the present disclosure without departing from the spirit and scope of the embodiments of the present disclosure. Therefore, if the modifications and variations of the embodiments of the present disclosure fall within the scope of claims of the present disclosure and its equivalent technologies, the present disclosure is also intended to include such modifications and variations.

What is claimed is:

1. A driving backplate, comprising:
a base substrate, comprising a display area and a fan-out area located on at least one side of the display area; wherein
the display area comprises a plurality of pixel units arranged in an array and a plurality of signal lines connected with the pixel units, and the signal lines extend in a first direction;
the fan-out area comprises fan-out lines, the fan-out lines are connected with the signal lines, each of the fan-out lines comprises a first end proximate to the display area and a second end away from the display area, and a width of the first end is greater than a width of the second end; and
at least one signal line is connected with at least one fan-out line through a connecting line, and the connecting line extends in a second direction.

2. The driving backplate according to claim 1, wherein a length of the connecting line is greater than or equal to a spacing distance between two adjacent pixel units in the second direction and less than or equal to a sum of a width of a pixel unit in the second direction and the spacing distance between the two adjacent pixel units.

3. The driving backplate according to claim 1, wherein the signal lines connected with the fan-out lines through connecting lines are connected with pixel unit columns on outmost sides.

4. The driving backplate according to claim 1, wherein at least one signal line is directly connected with at least one fan-out line.

5. The driving backplate according to claim 1, wherein the fan-out area is folded to an opposite side of a display side of the driving backplate, and a minimum distance between the connecting line and a bending axis in the first direction is greater than 150 μm.

6. The driving backplate according to claim 1, wherein a minimum distance between the fan-out lines and a boundary of the base substrate in the second direction is greater than 1000 μm.

7. The driving backplate according to claim 1, wherein a gap between two adjacent signal lines in the second direction is greater than 100 μm and a gap between two adjacent connecting lines in the first direction is greater than 100 μm.

8. The driving backplate according to claim 1, wherein the fan-out area comprises a first fan-out area located on a side of the display area; and
parts of the fan-out lines in the first fan-out area are connected with the signal lines through connecting lines, and a rest of the fan-out lines are directly connected with the signal lines.

9. The driving backplate according to claim 8, wherein the fan-out area further comprises a second fan-out area, and the second fan-out area and the first fan-out area are located on two sides of the display area in the second direction respectively; and the fan-out lines in the second fan-out area are directly connected with the signal lines.

10. The driving backplate according to claim 9, wherein the signal lines comprise a plurality of data signal lines, a plurality of reference signal lines and a plurality of positive signal lines;
each pixel unit column is electrically connected with one data signal line, one reference signal line and one positive signal line correspondingly, and a distance between a boundary of the base substrate and the data signal line corresponding to the pixel unit column, a distance between the boundary of the base substrate and the reference signal line corresponding to the pixel unit column and a distance between the boundary of the base substrate and the positive signal line corresponding to the pixel unit column are sequentially increased;

the pixel units form M pixel unit columns sequentially arranged in the second direction, wherein two pixel unit columns on outmost sides are respectively a first pixel unit column and an $M^{th}$ pixel unit column, and, in the second direction, a distance between a data signal line corresponding to the first pixel unit column and a boundary of the base substrate is less than a distance between a data signal line corresponding to the $M^{th}$ pixel unit column and a boundary of the base substrate;

the data signal lines corresponding to the first pixel unit column, a second pixel unit column and the $M^{th}$ pixel unit column respectively are connected with the fan-out lines in the first fan-out area through connecting lines;

the data signal lines corresponding to a third pixel unit column to an $(M-1)^{th}$ pixel unit column respectively are directly connected with the fan-out lines in the first fan-out area; and the plurality of reference signal lines and the plurality of positive signal lines are directly connected with the fan-out lines in the second fan-out area.

11. The driving backplate according to claim 10, wherein the signal lines further comprise transfer signal lines between the data signal lines and the reference signal lines and between the $M^{th}$ pixel unit column and the boundary of the base substrate, and each of the transfer signal line is electrically connected with a pixel unit row;

the transfer signal line between the data signal line and the reference signal line corresponding to the first pixel unit column, the transfer signal line between the data signal line and the reference signal line corresponding to the $M^{th}$ pixel unit column and the transfer signal line between the $M^{th}$ pixel unit column and the boundary of the base substrate are connected with the fan-out lines in the first fan-out area through the connecting lines; and the transfer signal lines between the data signal lines and the reference signal lines corresponding to the third pixel unit column to the $(M-1)^{th}$ pixel unit column respectively are directly connected with the fan-out lines in the first fan-out area.

12. The driving backplate according to claim 11, further comprising a plurality of scanning signal lines, wherein the scanning signal lines extend between the pixel unit rows in the second direction, and each of the scanning signal lines is electrically connected with one transfer signal line.

13. The driving backplate according to claim 12, comprising a first conducting layer and a second conducting layer which are sequentially arranged on the base substrate and are insulated from each other; wherein the data signal lines, the reference signal lines, the positive signal lines and the transfer signal lines are located in the first conducting layer, and the scanning signal lines are located in the second conducting layer.

14. The driving backplate according to claim 9, further comprising a first binding area arranged on a side of the first fan-out area away from the display area and a second binding area arranged on a side of the second fan-out area away from the display area; wherein, the first binding area is provided with a first chip, and the fan-out lines in the first fan-out area are in binding connection with the first chip;

the second binding area is provided with a second chip and a third chip, and the second chip and the third chip are symmetrically arranged with respect to a central axis of the display area in the first direction; and the fan-out lines in the second fan-out area located on a side of the central axis of the display area in the first direction are in binding connection with the second chip, and the fan-out lines in the second fan-out area located on the other side of the central axis of the display area in the first direction are in binding connection with the third chip.

15. A display panel, comprising the driving backplate according to claim 1 and a plurality of micro light-emitting diodes electrically connected with the driving backplate.

16. A display apparatus, comprising the plurality of display panels according to claim 15, wherein the plurality of display panels are arranged in a splicing mode.

17. The driving backplate according to claim 2, wherein the fan-out area is folded to an opposite side of a display side of the driving backplate, and a minimum distance between the connecting line and a bending axis in the first direction is greater than 150 μm.

18. The driving backplate according to claim 3, wherein the fan-out area is folded to an opposite side of a display side of the driving backplate, and a minimum distance between the connecting line and a bending axis in the first direction is greater than 150 μm.

19. The driving backplate according to claim 4, wherein the fan-out area is folded to an opposite side of a display side of the driving backplate, and a minimum distance between the connecting line and a bending axis in the first direction is greater than 150 μm.

20. The driving backplate according to claim 2, wherein a minimum distance between the fan-out lines and a boundary of the base substrate in the second direction is greater than 1000 μm.

* * * * *